United States Patent
Fletcher et al.

(10) Patent No.: US 11,144,110 B2
(45) Date of Patent: Oct. 12, 2021

(54) COMPUTER SYSTEM POWER MONITORING

(71) Applicant: Apple Inc., Cupertino, CA (US)

(72) Inventors: Jay B. Fletcher, Sunnyvale, CA (US); Karthik Manickam, Santa Clara, CA (US); Bo Yang, Santa Clara, CA (US); Vincent R. von Kaenel, Palo Alto, CA (US); Shawn Searles, Austin, TX (US); Hubert Attah, Santa Clara, CA (US); Nir Dahan, Puchheim (DE); Olivier Girard, Munich (DE)

(73) Assignee: Apple Inc., Cupertino, CA (US)

( * ) Notice: Subject to any disclaimer, the term of this patent is extended or adjusted under 35 U.S.C. 154(b) by 229 days.

(21) Appl. No.: 16/039,842

(22) Filed: Jul. 19, 2018

(65) Prior Publication Data
US 2020/0026345 A1   Jan. 23, 2020

(51) Int. Cl.
*G06F 1/32*       (2019.01)
*G06F 1/3296*    (2019.01)
*G01R 31/28*     (2006.01)
*G06F 1/3206*    (2019.01)

(52) U.S. Cl.
CPC ....... *G06F 1/3296* (2013.01); *G01R 31/2851* (2013.01); *G06F 1/3206* (2013.01)

(58) Field of Classification Search
CPC .................................... G06F 1/32; G06F 9/44
See application file for complete search history.

(56) References Cited

U.S. PATENT DOCUMENTS

| | | | | |
|---|---|---|---|---|
| 5,507,788 | A * | 4/1996 | Lieber ................ | A61N 1/36003 607/48 |
| 8,125,200 | B2 | 2/2012 | Tsai et al. | |
| 9,323,320 | B2 | 4/2016 | Fitzpatrick et al. | |
| 2007/0174642 | A1 * | 7/2007 | Cornwell ................. | G06F 1/26 713/300 |
| 2008/0012583 | A1 * | 1/2008 | Audet ..................... | H01L 23/50 324/713 |
| 2010/0237891 | A1 * | 9/2010 | Lin ..................... | G01R 31/2851 324/750.3 |
| 2016/0091941 | A1 | 3/2016 | C.R. et al. | |
| 2017/0083069 | A1 * | 3/2017 | DiBene, II .......... | G01R 19/255 |
| 2017/0364131 | A1 * | 12/2017 | Mellteg ..................... | G06F 1/26 |
| 2019/0121483 | A1 * | 4/2019 | Liu ......................... | H02M 3/07 |
| 2019/0235008 | A1 * | 8/2019 | Yates ........................ | G06F 1/26 |

* cited by examiner

*Primary Examiner* — Keshab R Pandey
(74) *Attorney, Agent, or Firm* — Kowert, Hood, Munyon, Rankin & Goetzel, P.C.

(57) ABSTRACT

A voltage regulator circuit included in a computer system may generate a voltage level on a power supply signal using a source power supply signal and based initial values of one or more operation parameters derived from wafer-level test data. One or more operation characteristics of the voltage regulator circuit may be sampled, by a measurement circuit, at multiple time points to generated measurement data. A control circuit may adapt operation of the voltage regulator circuit based on the measurement data.

20 Claims, 9 Drawing Sheets

US 11,144,110 B2

COMPUTER SYSTEM POWER MONITORING

TECHNICAL FIELD

This disclosure relates to power management in computer systems and more particularly to monitoring voltage regulator circuit performance during computer circuit operation.

DESCRIPTION OF THE RELATED ART

Modern computer systems may include multiple circuits blocks designed to perform various functions. For example, such circuit blocks may include processors, processor cores configured to executed execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more voltage regulator circuits configured to generated regulator voltage levels on respective power supply signals using a voltage level of a source power supply signal. Such regulator circuits may employ multiple passive circuit elements, such as inductors, capacitors, and the like.

SUMMARY OF THE EMBODIMENTS

Various embodiments of a method for power monitoring of a computer system are disclosed. Broadly speaking, a voltage regulator circuit may be configured to generate a voltage level on a power supply signal of the computer system using a source power supply signal and based on initial values of one or more operation parameters derived from wafer-level test data. A measurement circuit may be configured to sample one or more operation characteristics of the voltage regulator circuit at a plurality of time points to generate measurement data. A control circuit configured to adapt operation of the voltage regulator circuit based on the measurement data.

In another embodiment, to adapt the operation of the voltage regulator circuit, the control circuit may be further configured to adjust a value of at least one operation parameter of one or more operation parameters of the voltage regulation circuit.

In a non-limiting embodiment, at least one passive circuit element is coupled to the voltage regulator circuit. To sample the one or more operation characteristics of the voltage regulator circuit, the measurement circuit may be further configured to generate a stimulation signal, apply the stimulation signal to the at least one passive circuit element and measure a response of the at least one passive circuit element to the stimulation signal.

Figure 1:
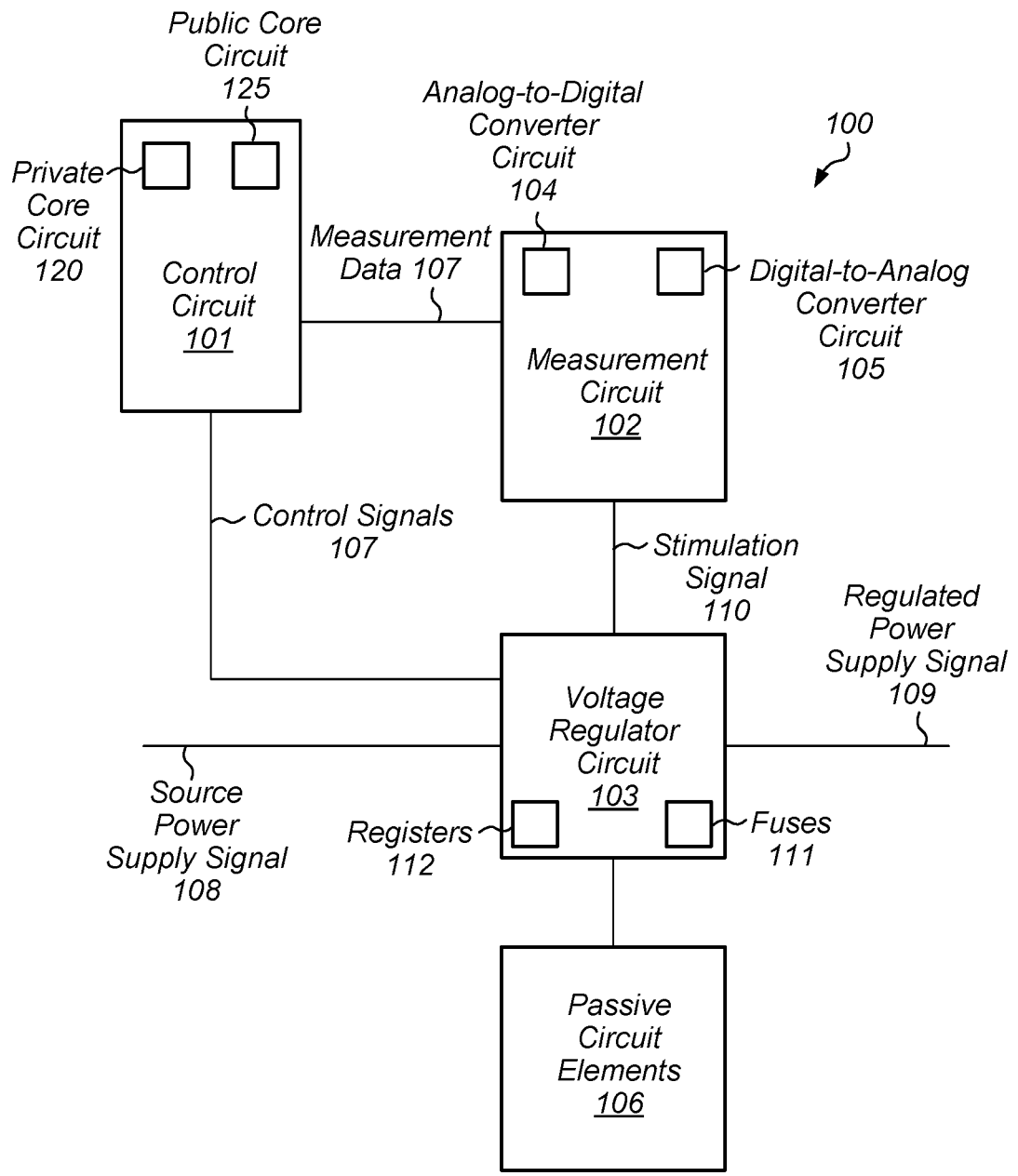
FIG. 1 is a block diagram of an embodiment of a power management circuit for a computer system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Computer systems may include multiple circuit blocks configured to perform specific functions. Such circuit blocks may be fabricated on a common silicon substrate and may employ different power supply voltage levels. Power management units (commonly referred to as "PMUs") may include multiple voltage regulator circuits configured to generate regulated voltage levels for various power supply signals. Such voltage regulator circuits may employ multiple passive circuit elements, such as, inductors or capacitors, for example. In some computer systems, the circuit blocks, the PMUs, and the passive circuit elements may be fabricated on different silicon substrates, and then mounted into a common package or on a common substrate.

Prior to mounting the circuit blocks, the PMUs, and the passive circuit elements into the common package on onto the common substrate, the circuit blocks, PMUs, and passive circuit elements are tested. Some analog circuits included in the PMUs, such as, e.g., the voltage regulator circuits, may be trimmed or adjusted by blowing fuses or other suitable method, to achieve desired performance goals based on results of being tested. Since the analog circuits are not coupled to the passive circuit elements at the time of testing, any trimming or adjustments made to the analog circuits may be questionable as the operation of such circuits may change once the analog circuits are mounted and coupled to the passive circuit elements.

In addition to not knowing the values of the passive circuit elements, component values of transistors included in the voltage regulator circuits, as well as the passive circuit elements, may change over time, which can degrade the operation of the voltage regulator circuits. Also, at the time a voltage regulator circuit is trimmed, there may be little, if any, information regarding the power consumption profile of circuits that will be coupled to the regulator. This may result in the voltage regulator circuit not being set for optimum use of different regulator modes based on current consumed by load circuits.

To account for the above-referenced changes in component values, and lack of knowledge regarding passive circuit elements and power profiles, voltage regulator circuits are often over-designed by adding extra margin to compensate for the unknown and changing values. The additional margin can add area, complexity, and power consumption to the voltage regulator circuit. The embodiments illustrated in the drawing and described below may provide techniques for adapting operation of voltage regulator circuits using measurements made post-assembly, thereby reducing are, complexity, and power consumption, of the design of voltage regulator circuits, as well as improving voltage regulator operation and performance.

A block diagram of a power management circuit included in a computer system is illustrated in FIG. 1. In the illustrated embodiment, power management circuit 100 includes control circuit 101, measurement circuit 102, voltage regulator circuit 103, and passive circuit elements 106. In some embodiments, the circuit blocks depicted in the power management circuit 100 may be included in a single integrated circuit, while in other embodiments, one or more of the illustrated circuit blocks may be located in separate integrated circuits.

Voltage regulator circuit 103 may be configured to generate a voltage level on regulated power supply signal 109 using source power supply signal 108 and based on initial values of one or more operation parameters. As used and described herein, an operation parameter is a variable that affects the operation of a circuit. For example, an operation parameter may change a mode of operation of the circuit, modify timing of a circuit, change a bias point of an analog circuit, or any other suitable variables. In various embodiments, the initial values of the one or more operation parameters may be based on wafer-level test data that is gather prior to assembly of computer system. In some cases, the initial values may be encoded in fuses 111 or other suitable non-volatile storage circuit.

Such operation parameters may be stored in registers 112 or encoded in a state of fuses 111. Registers 112 may include one or more latch or flip-flop circuits, while fuses 111 may be blown prior to assembly, based on data gather during initial testing. In various embodiments, a target voltage level, mode of operation, or other operation parameter of voltage regulator circuit 103 may be adapted or modified based on control signals 107 generated by control circuit 101. In some cases, control signals 107 may modify values stored in registers 112. Although only a single voltage regulator circuit is depicted in the embodiment of FIG. 1, in other embodiments, any suitable number of voltage regulator circuits may be employed, each configured to generate a respective regulator voltage level on a respective power supply signal.

In some embodiments, voltage regulator circuit 103 may be a particular embodiment of a buck regulator circuit that employs passive circuit elements, such as, inductors, for example. Such passive circuit element may be included in passive circuit elements 106, which may include inductors, capacitors, resistors, or any other suitable passive circuit elements. In some cases, passive circuit elements 106 may be fabricated on a common silicon wafer or substrate as voltage regulator circuit 103. Alternatively, passive circuit elements 106 may be fabricated on a silicon wafer or substrate different from the silicon wafer or substrate on which voltage regulator circuit 103 is fabricated.

Measurement circuit 102 may be configured to sample one or more operation characteristics of the voltage regulator circuit at a plurality of time points to generate measurement data 107. In some cases, measurement circuit 102 is configured to sample the one or more operating characteristics of voltage regulator circuit 103 in response to an activation of a test mode of computer system 100.

As used and described herein an operation characteristic is a characteristic of an operating circuit. For example, operation characteristics of a circuit can include, without limitation, a voltage level of a circuit node include in the circuit, a current consumption of the current, a current flowing through a particular circuit element include in the circuit, and the like. In some embodiments, the one or more operation characteristics include a voltage level of the source power supply signal 108.

Additionally, measurement circuit 102 may be further configured to generate stimulation signal 110, apply the stimulation signal to the at least one passive circuit element included in passive circuit elements 103, and measure a response of the at least one passive circuit element to the stimulation signal. By stimulating a passive circuit element using a generated stimulation signal, measurement circuit 102 can generate data that may be used to determine a component value of the passive circuit element after computer system 100 has been packaged.

To measure operation characteristics and generate stimulation signals, measurement circuit 102 may employ digital-to-analog converter circuits and analog-to-digital converter circuits. In the illustrated embodiment, measurement circuit 102 includes analog-to-digital converter circuit 104 and digital-to-analog converter circuit 105. As described below in more detail, analog-to-digital converter circuit 104 and digital-to-analog converter circuit 105 may be used to measure operating characteristic of voltage regulator circuit 103 or generate stimulus for voltage regulator circuit 103 or passive circuit elements 106, in other to perform additional operating characteristic measurements.

Digital-to-analog converter circuit 105 may be configured to convert a particular digital data work to corresponding voltage or current level that may be used, as described above, a stimulation signal that is applied to a passive circuit element or other circuit node or element included in voltage regulator circuit 103. In various embodiments, digital-toanalog converter circuit 105 may be a particular embodiment of a pulse-width modulator circuit, a delta-sigma converter circuit, binary-weighted converter circuit, or any other suitable type of digital-to-analog converter circuit architecture. Although only a signal digital-to-analog converter circuit is depicted in the embodiment of FIG. 1, in other embodiments, any suitable number of digital-to-analog converter circuits may be employed.

Analog-to-digital converter circuit 104 may be configured to converter a continuous-time and continuous-amplitude voltage level of a circuit node included in voltage regulator circuit 103 to a corresponding digital data word. In various embodiments, analog-to-digital converter circuit 104 may sample the voltage level of the circuit node at multiple points in time, to generate corresponding digital data words, where a particular digital data word is indicative of a magnitude of the voltage level of the circuit node. In some cases, analog-to-digital converter circuit 104 may be combined with other sensors circuits (not shown) to allow for the generation of digital data for other operating characteristics of voltage regulator circuit 103, such as, output current, for example. Although only one analog-to-digital converter circuit is depicted in the embodiment of FIG. 1, in other embodiments, any suitable number of analog-to-digital converter circuits may be employed.

In addition to analog-to-digital converter circuits, and digital-to-analog converter circuits, measurement circuit 102 may include any suitable combination of logic gates, analog bias circuits, state machines, sequential logic circuits, and the like. In some cases, measurement circuit 102 may include a controller or other general-purpose processor or processor core.

As described above, once assembled in a package, voltage regulator circuit 103 may not operate as intended. To allow for adjustments to the operation of voltage regulator circuit 103 once computer system 100 has been assembled, control circuit 101 may be configured to adapt operation of voltage regulator circuit 103 based on measurement data 107. To adapt the operation of the voltage regulator circuit 103, control circuit 101 is further configured to adjust a value of at least one operation parameter of the one or more operation parameters of the voltage regulation circuit 103.

In order to adjust the at least one operation parameter of voltage regulator circuit 103, control circuit 101 is further configured to change a duration of an active cycle of voltage regulator circuit 103 based on the voltage level of source power supply signal 108.

In addition to using measurement data 107 to adapt the operation of voltage regulator circuit 103, control circuit 101 may use other information regarding computer system 100. For example, in some embodiments, control circuit 101 is configured to monitor operation of the computer system and adjust an operating mode of the voltage regulator circuit based on results of the monitoring.

To isolate certain functions from general access, thereby improving security of the computer system, control circuit 101 includes private core circuit 120 and public core circuit 125. Private core circuit 120 is isolated from external signals, communication busses, and the like, allowing the performance of mission critical operations in an isolated fashion. On the other hand, public core circuit 125 is configured to perform various public operations that may be accessible by a user, program or application software being executed on the computer system, and the like.

In various embodiments, private core circuit 120 may be configured to perform platform power state switching, power-rail control, safety-related measurement and monitoring, and system integrity check. Additionally, private core circuit 120 may also be configured to perform the above-described parameter adaptation in response to environment changes, synchronization between different power management circuits within a computer system, as well as battery-related measurements such as state of the battery charge and state of battery health.

Public core circuit 125 is configured to allow limited user access during certain modes of operation. For example, during a boot phase of the computer system, firmware used by public core circuit 125 may be modified. Public core circuit 125 may be isolated from certain portion of the computer system to prevent to prevent malicious firmware from compromising the power management circuit. In some cases, resources, such as, e.g., register circuits, memory circuits, monitor circuits, etc., available to public core circuit 125 may also be protected.

As described above, public core circuit 125 may perform public operations associated with the power management circuit. For example, public core circuit 125 may be configured to perform a variety of telemetry measurements, collect and post-process data relating to operation of the power management circuit, and profiling power usage of the computer system. During manufacturing, assembly, and testing, public core circuit 125 may be configured to perform self-test or trimming algorithms to tune voltage regulator circuit 103. In some cases, public core circuit 125 may be configured to transmit collected data, status information, event detections, and the like, to the computer system using a communication bus, a dedicated interface circuit (not shown), or any other suitable communication circuits.

In various embodiments, private core circuit 120 and public core circuit 125 may be a particular embodiments of general-purpose processors or processor cores configured to execute software or program instructions stored in a memory (not shown). Alternatively, private core circuit 120 and public core circuit 125 may include dedicated state machines or sequential logic circuits, which include multiple logic gates, latch circuits, and flip-flop circuits. Although only a single private core circuit and a single public core circuit are depicted in the embodiment illustrated in FIG. 1, in other embodiments, any suitable number of private and public core circuits may be employed. In some embodiments, private core circuit 120 may be resident in a secure element of public core circuit 125 or in a secure element of a system-on-a-chip (SoC) or processor that includes one or more of private core circuit 120 and public core circuit.

It is noted that the embodiment depicted in FIG. 1 is merely an example. In other embodiments, different circuit blocks and different arrangements of circuit blocks are possible and contemplated.

Figure 2:
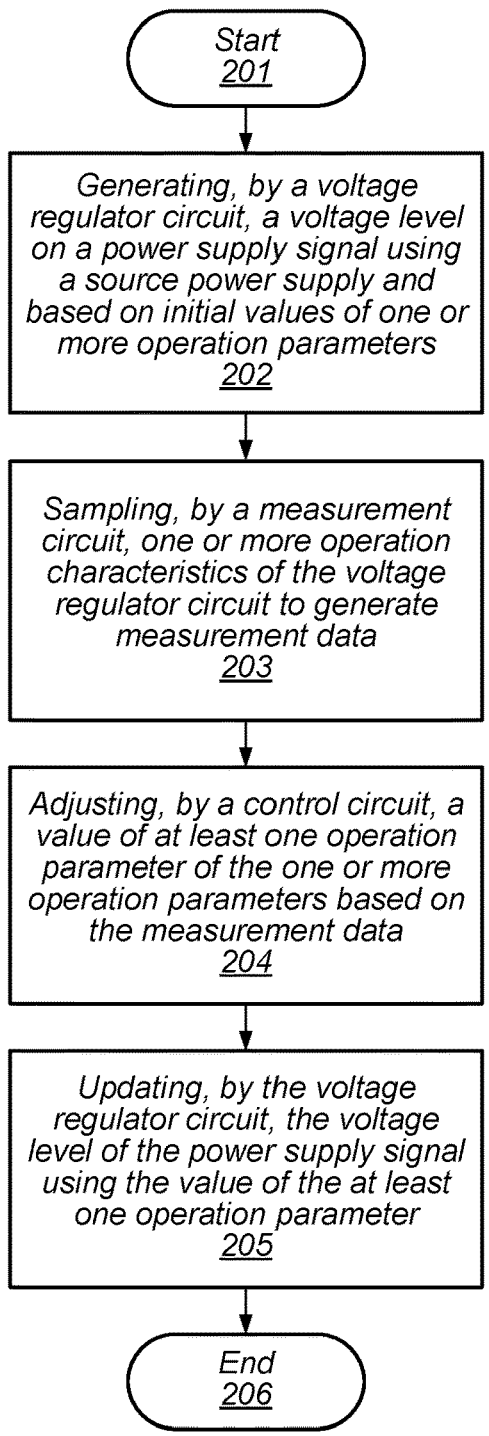
FIG. 2 illustrates a flow diagram depicting an embodiment of a method for adjusting the operation of a voltage regulator circuit in a computer system.

Turning to FIG. 2, a flow diagram depicting an embodiment of a method for adjusting the operation of a voltage regulator circuit is illustrated. Referring collectively to the block diagram of FIG. 1 and the flow diagram of FIG. 2, the method begins in block 201.

Voltage regulator circuit 103 may then generate a voltage level on power supply signal 109 using source power supply signal 108 and based on initial values of one or more operation parameters (block 202). In various embodiments, voltage regulator circuit 103 may be included a computer system, such as computer system 100, for example. The one or more operation parameters may be determined, in various embodiments, based on wafer-level testing performed on voltage regulator circuit 103 prior to assembly into the computer system. In some cases, values for the one or more operation parameters may be stored in a register during a boot-up sequence for the computer system, or by blowing one or more fuses included in the computer system.

Measurement circuit 102 may then sample one or more operation characteristics of voltage regulator circuit 103 to generate measurement data 107 (block 203). In various embodiments, measurement circuit 102 may employ one or more analog-to-digital converters, such as, e.g., analog-to-digital converter circuit 104, to sample voltage levels on one or more circuit nodes, currents flowing through particular circuits nodes, and the like. In some cases, data from the analog-to-digital converters may be stored in a memory or register file for later processing.

Control circuit 101 may then adjust a value of at least one operation parameter of the voltage regulator circuit based on the measurement data (block 204). For example, control circuit 101 may change a mode of operation of voltage regulator circuit, switching between pulse width modulation and pulse frequency modulation, or any other suitable mode. Alternatively, or additionally, control circuit 101 may change operation parameters that affect bias, drive current, or any other suitable operation parameter.

Voltage regulator circuit 103 may then update the voltage level of power supply signal 109 using an adjusted value of the at least one operation parameter (block 205). As described above, control circuit 101 may adjust values of various operation parameters of voltage regulator circuit 103. In some cases, the changes in operation parameters may select a different voltage level on power supply signal 109. In such cases, voltage regulator circuit 103 will adjust the amount of current delivered to load circuits to achieve the newly selected voltage level. In other cases, the changes in operation parameters may affect feedback loops within regulator circuit 103. When the operation parameters are change, the voltage level of power supply signal 109 may change until the feedback loops within voltage regulator circuit 103 re-regulated the voltage level on power supply signal 109 back to the desired voltage level. The method may then conclude in block 206.

It is noted that the embodiment depicted in the flow diagram of FIG. 2 is merely an example. In other embodiments, different operations and different orders of operations are possible and contemplated.

As described above, operation parameters for a voltage regulator circuit may be set based on wafer-level testing performed upon completion of a semiconductor manufacturing process. Once an integrated circuit chip including the voltage regulator circuit has been mounted (commonly referred to as an "assembly process") in a package or on a substrate and connected to passive devices, the operation of the voltage regulator circuit may differ due to difference in component values of passive circuit elements, wiring resistance in the package or on the substrate and the like. An embodiment of a method for adapting operation of a voltage regulator circuit is illustrated after an assembly process has been completed is illustrated in the flow diagram of FIG. 3. The method begins in block 301.

Wafer-level testing of a voltage regulator circuit included in a particular integrated circuit may then be performed to generate wafer-level data (block 302). In various embodiments, probe needles may be placed on terminals of the first integrated circuit to provide power signals, clock signals, input stimulus, and the like to the particular integrated circuit. Other probe needles may be placed on various points or terminals within the particular integrated circuit to collect data. Such data may include voltage levels of signals, logic levels of signals, power consumption of circuit blocks, and the like. In some cases, special modes of operation (commonly referred to as "test modes") may be activated within the voltage regulator circuit as well as the particular integrated circuit, to facilitate gathering test data. Each integrated circuit chip included on a wafer may be tested in such a manner.

One or more operation parameters of the voltage regulator circuit may then be set corresponding values based on the wafer-level data (block 303). In some cases, blowing one or more fusses included in the particular integrated circuit may set the operation parameters. The presence of absence of a fuse may be used as logic values to encode digital words of data corresponding to values of operation parameters. In some cases, the data may be stored and included in initialization software that is loaded into the particular integrated circuit during a boot-up or power-on sequence.

The particular integrated circuit and another integrated circuit may then be mounted on a common substrate (block 304). In various embodiments, the particular integrated circuit and the another integrated circuit may be soldered to the common substrate, which, in turn, may be mounted in a package, or on a circuit board. The common substrate can include multiple wires or routes that couple terminals of the particular integrated circuit with terminal of the another integrated circuit. The another integrated circuit may include passive circuit elements, such as, e.g., inductors, employed by the voltage regulator circuit included in the first integrated circuit.

After the mounting, one or more operation characteristics of the voltage regulator circuit may be sampled by a measurement circuit, such as measurement circuit 102, for example (block 305). As described above, the measurement circuit may measure voltage levels of circuit nodes, durations of signals, and any other relevant characteristics of the voltage regulator circuit.

A control circuit, such as, e.g., control circuit 101, may then adapt operation of the voltage regulator circuit based on resulting of sampling the one or more operation characteristics (block 306). As described above, adapting the operation of the voltage regulator circuit includes setting values of one or more operation parameters of the voltage regulator circuits. The values of the operation parameters affect aspects of the operation of the voltage regulator circuit such as, drive current of an output stage of the voltage regulator circuit, a mode of operation, such as, e.g., pulse width modulation, of the voltage regulator circuit, and the like. By adapting the operation of the voltage regulator circuit in such a fashion, the voltage regulator circuit may be tuned for the combination of passive circuit elements, parasitic circuit elements in the common substrate, and other effects not tested during wafer-level testing, thereby improving the performance of the voltage regulator circuit in the computer system. The method may conclude in block 307.

Figure 3:
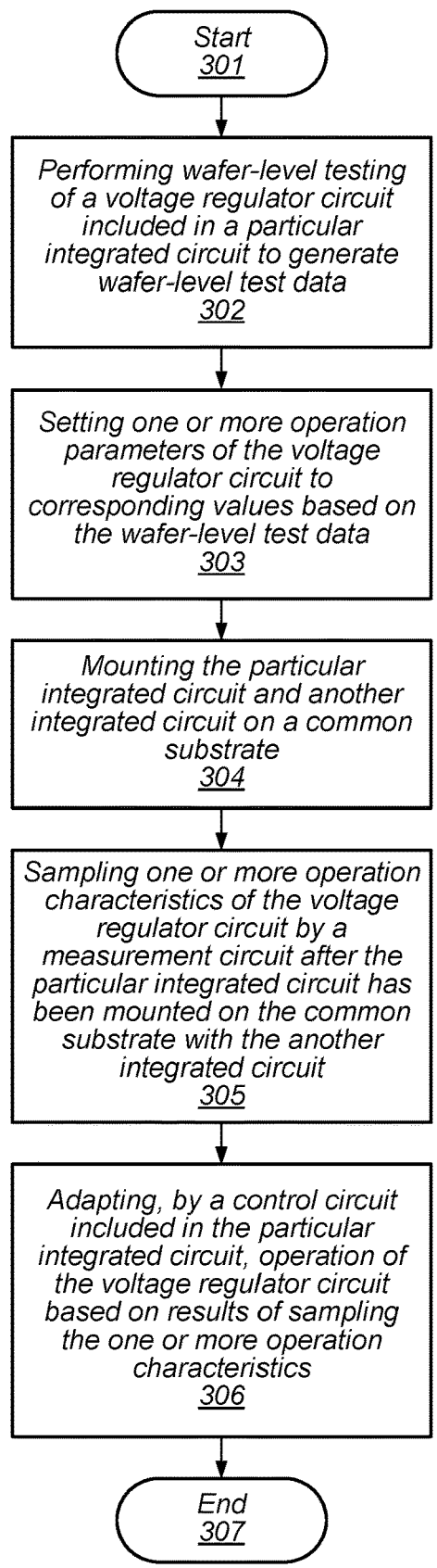
FIG. 3 illustrates a flow diagram depicting an embodiment of a method for adapting operation of a voltage regulator circuit.

It is noted that the embodiment of the method illustrated in FIG. 3 is only an example. In other embodiments, different numbers of integrated circuits may be mounted on the common substrate.

Figure 4:
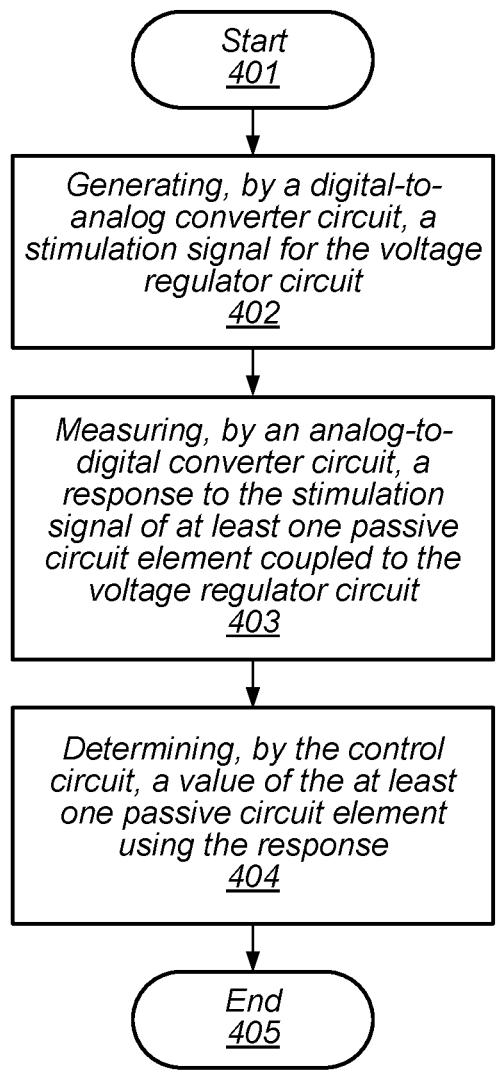
FIG. 4 illustrates a flow diagram depicting an embodiment of a method for determining a value of a passive circuit element coupled to a voltage regulator circuit.

As described above, the actual value of passive circuit elements, such as, e.g., inductors, coupled to a voltage regulator circuit can affect performance of the voltage regulator circuit. In order the ensure the voltage regulator circuit is performing efficiently with a particular set of passive circuit elements, it is valuable to know the values of the passive circuit elements, as well as the characteristics of any interconnect between an output of the voltage regulator circuit and the passive circuit elements. An embodiment of a method for determining a value of a passive circuit element coupled to a voltage regulator circuit is illustrated in the flow diagram of FIG. 4. The method begins in block 401.

A digital-to-analog converter circuit, such as, e.g., digital-to-analog converter circuit 105, may then generate a stimulation signal, such as stimulus signal 110, for example (block 402). In various embodiments, multiple data bits may be received by the digital-to-analog converter circuit, which translates the multiple data bits into a corresponding analog voltage level. A voltage level of the stimulation signal may be constant or may varying in time based on sequences of data bits received by the digital-to-analog converter circuit.

The stimulation signal may be applied to various circuit nodes or input/output terminals of the voltage regulator circuit. For example, the stimulation signal may be applied to an output terminal of the voltage regulator that is also coupled to a terminal of a passive circuit element. In some cases, additional circuits may be coupled between the digital-to-analog converter circuit and the circuit nodes or terminal in order to provide extra drive capability based on the load of the circuit nodes or terminals.

An analog-to-digital converter circuit, such as, e.g., analog-to-digital converter circuit 104, may then measure a response to the stimulation signal of at least one passive circuit element coupled to the voltage regulator circuit (block 403). In some cases, the analog-to-digital converter circuit may measure a voltage response at a terminal of the passive circuit element. Alternatively, the analog-to-digital converter circuit may measure a current passing through the passive circuit element. The measurement may be made over time, and the resultant voltage level data may be translated into a sequence of multiple data bits or data words. Such data bits or data words may be stored in a register file, memory, or other suitable storage circuit for later processing.

A control circuit, such as, e.g., control circuit 101, may then determine a value of the at least one passive circuit element using the response (block 404). In various embodiments, control circuit may perform a calculation using well-known relationships between current and voltage for a particular type of passive device. For example, in the case of a resistor, the control circuit may divide a voltage across the resistor by the current passing through the resistor to determine the value of the resistor. Similar calculations may be performed for inductors and capacitors. The determined value of the passive device may be stored, along with date and time information, in a register file, memory, or other suitable storage circuit, for future reference to determine any changes in component values over time. The method then concludes in block 405.

Figure 5:
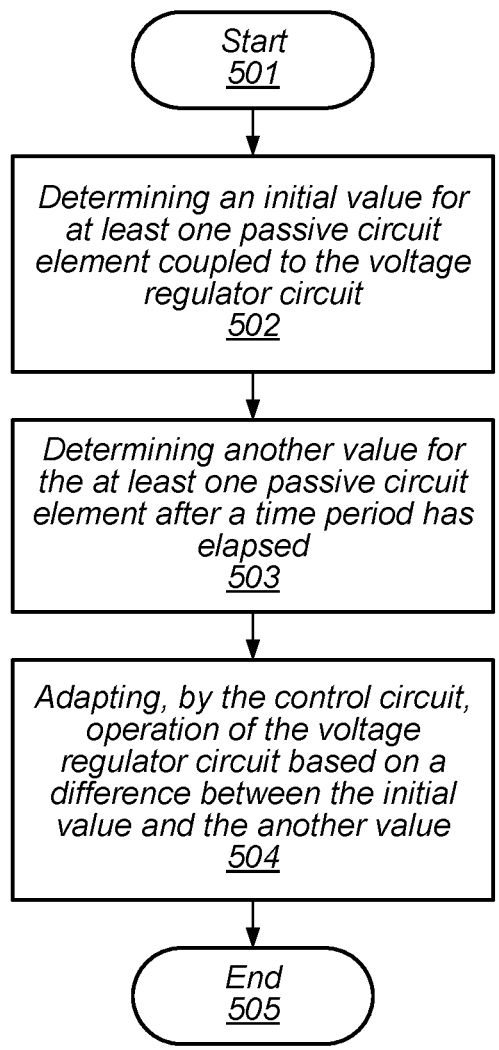
FIG. 5 illustrates a flow diagram depicting an embodiment of a method for adapting the operation of a voltage regulator circuit based on aging of passive circuit elements.

The passive circuit elements used by a voltage regulator circuit may change value as they age. For example, application of voltage potentials across the terminals of such passive devices, as well as thermal fluctuations during operation, may cause changes in the metal lattice of the passive circuit element resulting in different physical properties. Such changes in the physical of the passive circuit elements can cause a voltage regulator circuit to operate inefficiently, or not be able to achieve a desired level of regulation. If, however, the changes in values of the passive circuit elements are known, operation of the voltage regulator circuit may be adapted to compensate for such changes in the passive circuit elements. An embodiment of a method for adapting the operation of a voltage regulator circuit based on aging of passive circuit elements is illustrated in the flow diagram of FIG. 5. The method begins in block 501.

An initial value of at least one passive circuit element coupled to a voltage regulator circuit may then be determined (block 502). In various embodiments, the value of the passive circuit element may be determined using a method similar to that described above in regard to flow diagram of FIG. 4. The determined value may be stored in a register file, memory, or other suitable storage circuit for later comparison.

After a time period has elapsed, another value for the at least one passive circuit element may be determined (block 503). As mentioned above, the other value of the passive circuit element may be determined a method similar to that described in the embodiment of FIG. 4. The duration of the time period may be programmable based on one more characteristics of the computer system, such as, the utilization of the computer system, for example. Alternatively, the determination of the other value may be made in response to determining a particular condition has occurred, such as, a signal from a user, a change in hardware of the computer system, or any other suitable condition.

A control circuit, such as, e.g., control circuit 101, may then adapt the operation of the voltage regulator circuit based on a difference between the initial value and the another value (block 504). The control circuit may retrieve the previously stored value of the passive circuit element and compare it to the newly determined value of the passive circuit element. The control circuit may then change values of one or more operation parameters of the voltage regulator circuit. By adapting the operation of the voltage regulator circuit in this fashion, the voltage regulator circuit may compensate for changes in the values of the passive circuit elements, thereby preventing inefficient or incorrect operation of the voltage regulator circuit. The method then concludes in block 505.

Figure 6:
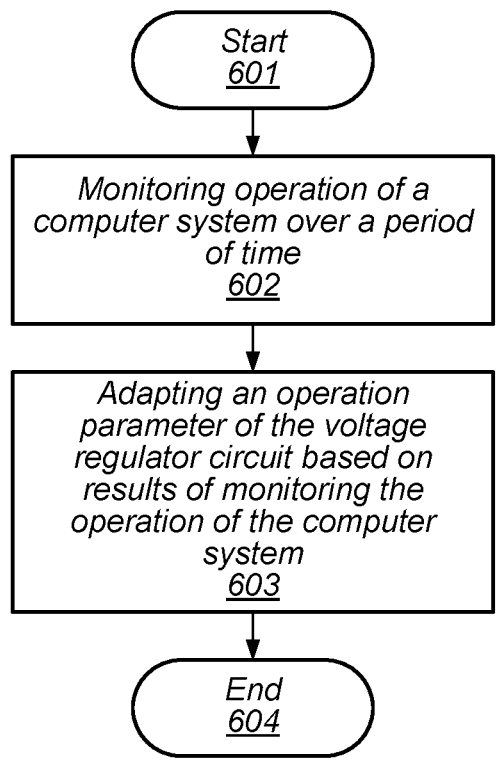
FIG. 6 illustrates a flow diagram depicting an embodiment of a method for adapting the operation of a voltage regulator circuit over time.

During operation of a computer system, component values for both active and passive circuit elements may change. In some cases, repeated use, or heat from operation, may alter a value of a passive device, a transconductance parameter of a transistor, or the like. When this occurs, circuits included in the computer system may not operate properly or as efficiently. By monitoring operation characteristics of circuits included in a computer system over time, operation parameters of the circuits may be adjusted to compensate for variations in the component values. An embodiment of adapting the voltage regulator circuit over time is illustrated in the flow diagram of FIG. 6. The method begins in block 601.

Operation of a computer system may then be monitored over a period of time (block 602). In various embodiments, the monitoring may include measuring operation characteristics of a voltage regulator circuit, or other circuits included in the computer system. Such measuring may be performed using analog-to-digital converter circuits as described above in more detail. Alternatively, or additionally, types of programs executed by the computer system, and characteristics of the executed programs, such as, numbers and types of instructions, may be tracked. Such information regarding executed programs may provide data relevant to power demands may during while executing such programs, which can be used to improve regulation of voltage levels for power supply signals included in the computer system.

In some cases, the aforementioned monitoring may be performed at regular time intervals. Such intervals may be programmable and may change as the computer system ages. Alternatively, the monitoring may be initiated in response to the detection of certain events, such as, installation of a new software program or application, operating system upgrade, change or replacement of a circuit block, or other piece of hardware included in the computer system. In some cases, the monitoring may be initiated by a user or service technician as part of debugging or troubleshooting difficulties with the computer system.

Operation parameters of the voltage regulator circuit may then be adapted based on results of monitoring the operation of the computer system (block 603). As described above, operation parameter values may be changed, which may affect a drive current of an output circuit of the regulator, bias levels of reference circuits, operation mode, and the like. For example, the drive current of the output stage of the regulator may be increased in response to determining that performance of transistors included in the output stage of the voltage regulator circuit has degraded. By modifying operation parameters of the voltage regulator circuit in this fashion, the performance of the voltage regulator circuit may be adjusted (or "adapted") to compensate for changes in component values, different use patterns in software, degrading of a source power supply, and the like. The method may then conclude in block 604.

Figure 7:
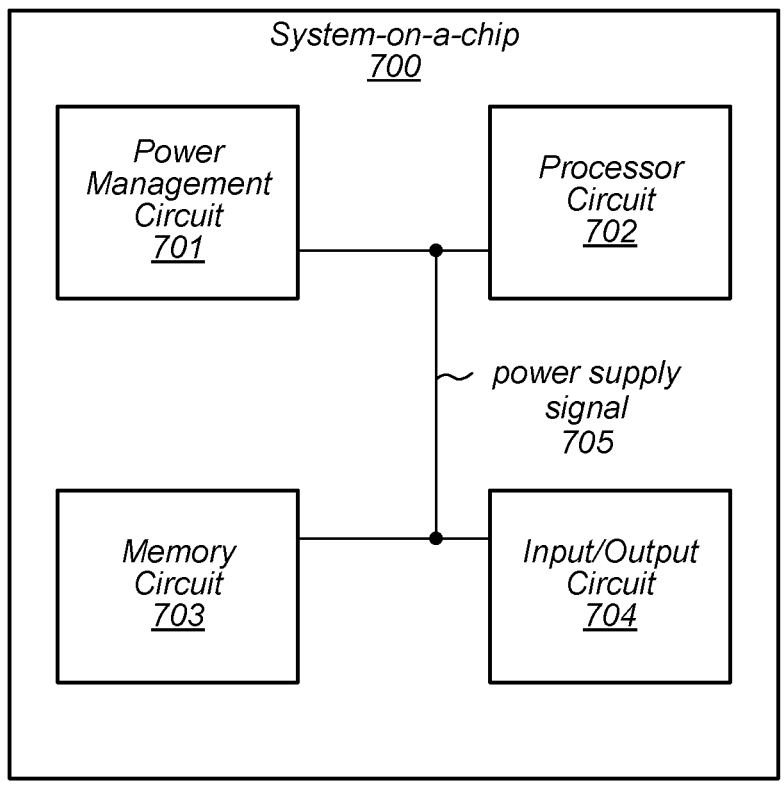
FIG. 7 is a block diagram of one embodiment of a system-on-a-chip that includes a power management circuit.

A block diagram of system-on-a-chip (SoC) is illustrated in FIG. 7. In the illustrated embodiment, the SoC 700 includes power management unit 701, processor circuit 702, input/output circuits 704, and memory circuit 703, each of which is coupled to power supply signal 705. In various embodiments, SoC 700 may be configured for use in a desktop computer, server, or in a mobile computing application such as, e.g., a tablet, laptop computer, or wearable computing device.

Power management unit 701 may be configured to generate a regulated voltage level on internal power supply 705 in order to provide power to processor circuit 702, input/output circuits 705, and memory circuit 703. In various embodiments, power management unit 701 may include one or more voltage regulator circuits, measurement circuits, and control circuits such as those depicted in the embodiment of FIG. 1. It is noted that although a single internal power supply is depicted in the embodiment of FIG. 7, in other embodiments any suitable number of internal power supplies may be employed.

Processor circuit 702 may, in various embodiments, be representative of a general-purpose processor that performs computational operations. For example, processor circuit 702 may be a central processing unit (CPU) such as a microprocessor, a microcontroller, an application-specific integrated circuit (ASIC), or a field-programmable gate array (FPGA).

Memory circuit 703 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of an integrated circuit illustrated in FIG. 7, a single memory circuit is depicted. In other embodiments, any suitable number of memory circuits may be employed.

Input/output circuits 704 may be configured to coordinate data transfer between SoC 700 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 704 may be configured to implement a version of Universal Serial Bus (USB) protocol or IEEE 1394 (Firewire®) protocol.

Input/output circuits 704 may also be configured to coordinate data transfer between SoC 700 and one or more devices (e.g., other computing systems or integrated circuits) coupled to SoC 700 via a network. In one embodiment, input/output circuits 704 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 704 may be configured to implement multiple discrete network interface ports.

Figure 8:
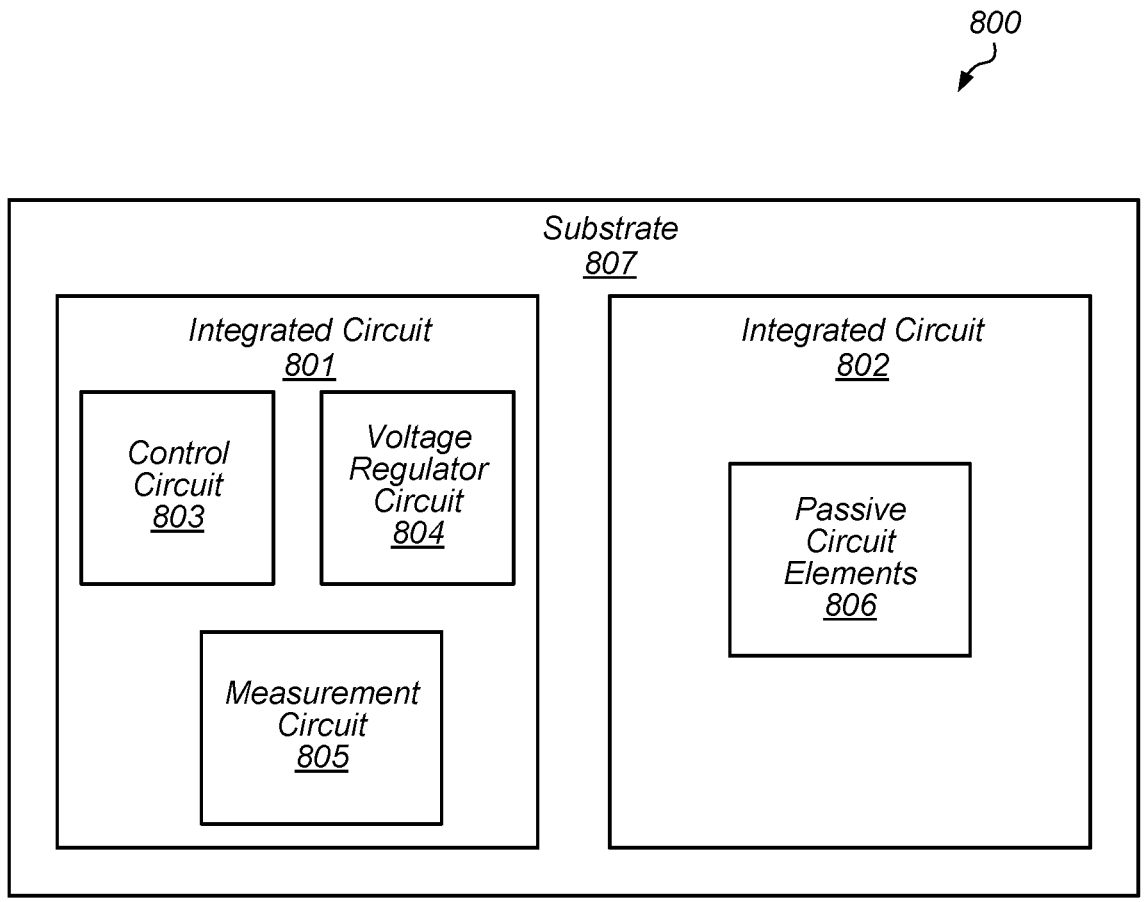
FIG. 8 is a block diagram of an embodiment of a computer system including two integrated circuits coupled to a common substrate.

In some computer systems, multiple integrated circuit chips are mounted on a common substrate. An embodiment of such a computer system is illustrated in FIG. 8. In the illustrated embodiment, computer system 800 includes integrated circuit 801 and integrated circuit 802, each of which is mounted on substrate 807.

Substrate 807 may, in various embodiments, be a circuit board, silicon substrate, or other similar material, and may include one or more conductive layers separated by insulating layers. On a given conductive layer, multiple traces or routes may be formed from a conductive material such as metal. In some cases, connections between a trace on one conductive layer and a trace on another conductive layer using a via, or other similar structure, through an insulating layer may be employed. Pins, solder bumps, or other suitable terminals on integrated circuit 801 and integrated circuit 802 may be coupled using the aforementioned traces or routes.

Integrated circuit 801 includes control circuit 803, voltage regulator circuit 804, and measurement circuit 805. In various embodiments, control circuit 803, voltage regulator circuit 804, and measurement circuit 805 may correspond to control circuit 101, voltage regulator circuit 103, and measurement circuit 102, respectively. In some cases, integrated circuit 801 may be manufactured separately from integrated circuit 802. After manufacturing has been completed, integrated circuit 801 may be tested while still in wafer form, to determine functionality of control circuit 803, voltage regulator circuit 804, and measurement circuit 805, as well as to determine one or more operating characteristics of the aforementioned circuits. As described above, one or more operation parameters may be determined and set, by blowing fuses included in integrated circuit 801, for example, prior to mounting integrated circuit 801 on substrate 807. Although only three circuit blocks are depicted in integrated circuit 801, in other embodiments, any suitable number and type of circuit blocks may be included in integrated circuit 801.

Integrated circuit 802 includes passive circuit elements 806. In various embodiments, passive circuit elements 806 may correspond to passive circuit elements 106 as depicted in the block diagram of FIG. 1. Passive circuit elements 806 include any suitable combination of resistors, capacitors, inductors, any other suitable circuit elements that do not provide a voltage or current gain in a circuit. In some cases, integrated circuit 802 is fabricated using a different semiconductor manufacturing process that is used to fabricated integrated circuit 801.

Although only two integrated circuit chips are shown mounted on substrate 807, in other embodiments, any suitable number of integrated circuit chips may be mounted on substrate 807.

Figure 9:
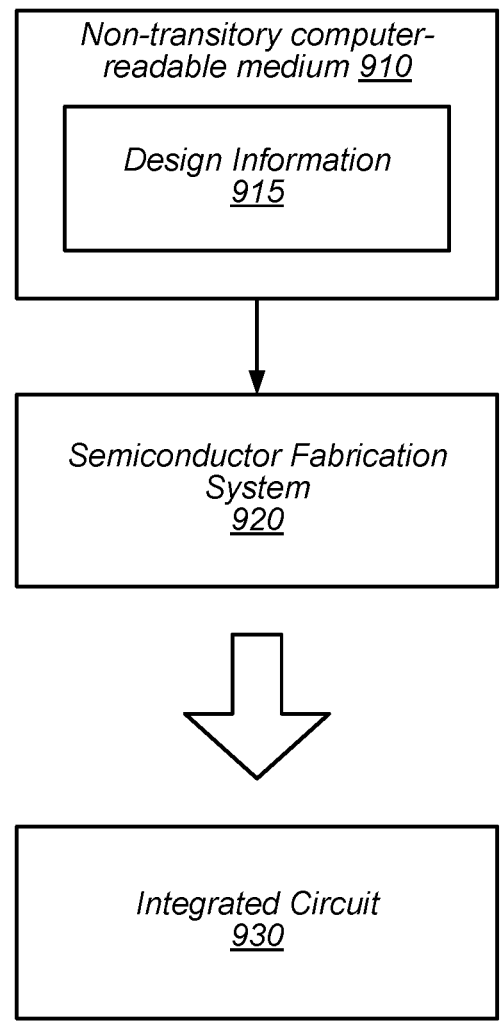
FIG. 9 is a block diagram of a computer-readable medium storing design information for an integrated circuit.

FIG. 9 is a block diagram illustrating an example non-transitory computer-readable storage medium that stores circuit design information, according to some embodiments. In the illustrated embodiment, semiconductor fabrication system 920 is configured to process the design information 915 stored on non-transitory computer-readable storage medium 910 and fabricate integrated circuit 930 based on the design information 915.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Non-transitory computer-readable storage medium 910 may include two or more memory mediums which may reside in different locations, e.g., in different computer systems that are connected over a network.

Design information 915 may be specified using any of various appropriate computer languages, including hardware description languages such as, without limitation: VHDL, Verilog, SystemC, SystemVerilog, RHDL, M, MyHDL, etc. Design information 915 may be usable by semiconductor fabrication system 920 to fabricate at least a portion of integrated circuit 930. The format of design information 915 may be recognized by at least one semiconductor fabrication system, such as semiconductor fabrication system 920, for example. In some embodiments, design information 915 may include a netlist that specifies elements of a cell library, as well as their connectivity. One or more cell libraries used during logic synthesis of circuits included in integrated circuit 930 may also be included in design information 915. Such cell libraries may include information indicative of device or transistor level netlists, mask design data, characterization data, and the like, of cells included in the cell library.

Integrated circuit 930 may, in various embodiments, include one or more custom circuit blocks or macrocells, such as memories, analog or mixed-signal circuits, and the like. In such cases, design information 915 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 is configured to operate according to a circuit design specified by design information 915, which may include performing any of the functionality described herein. For example, integrated circuit 930 may include any of various elements shown or described herein. Further, integrated circuit 930 may be configured to perform various functions described herein in conjunction with other components. Further, the functionality described herein may be performed by multiple connected integrated circuits.

As used and described herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a voltage regulator circuit configured to generate a voltage level on a power supply of a computer system using a source power supply wherein the voltage level is based on initial values of one or more operation parameters derived from wafer-level test data;
    a passive circuit element coupled to the voltage regulator circuit;
    a measurement circuit configured, in response to an activation of a test mode, to:
        convert a plurality of bits to an analog voltage level to generate a stimulation signal;
        apply the stimulation signal to the passive circuit element; and
        measure a response of the passive circuit element to the stimulation signal;
        sample, at a plurality of sample time points, the response of the passive circuit element to generate corresponding ones of a plurality of data words; and
    a control circuit configured to adapt operation of the voltage regulator circuit based on the plurality of data words.

2. The apparatus of claim 1, wherein to adapt the operation of the voltage regulator circuit, the control circuit is further configured to adjust a value of at least one operation parameter of one or more operation parameters of the voltage regulation circuit.

3. The apparatus of claim 2, wherein to adjust the value, the control circuit is further configured to change a duration of an active cycle of the voltage regulator circuit based on the voltage level of the source power supply.

4. The apparatus of claim 2, wherein the passive circuit element includes an inductor, and wherein the measurement circuit is further configured to activate the test mode at a plurality of time points.

5. The apparatus of claim 4, wherein the voltage regulator circuit, the measurement circuit, and the control circuit are included in a first integrated circuit, and the passive circuit element is included in a second integrated circuit.

6. The apparatus of claim 1, wherein the control circuit is further configured to monitor operation of the computer system, and wherein to adapt the operation of the voltage regulator circuit, the control circuit is further configured to adjust an operating mode of the voltage regulator circuit based on results of monitoring the operation.

7. The apparatus of claim 1, wherein the control circuit includes a private core circuit isolated from external signals and buses configured to perform at least one private operation as part of adapting the operation of the voltage regulator circuit, and a public core circuit accessible by the computer system, wherein the public core circuit is configured to execute software to perform at least one public operation as part of adapting the operation of the voltage regulator circuit.

8. A method, comprising:
performing wafer-level testing on a particular integrated circuit that includes a voltage regulator circuit to generate wafer-level test data;
setting one or more operation parameters of the voltage regulator circuit based on the wafer-level test data;
mounting the particular integrated circuit with a different integrated circuit on a common substrate;
activating a test mode at respective time periods of a plurality of time periods;
in response to activating the test mode:
converting, by a measurement circuit, a plurality of bits to an analog voltage level to generate a stimulation signal;
applying, by the measurement circuit, the stimulation signal to a passive circuit element coupled to the voltage regulator circuit;
measuring, by the measurement circuit, a response of the passive circuit element after the particular integrated circuit has been mounted on the common substrate with the different integrated circuit;
sampling, at a plurality of sample time points, the response to of the passive circuit element to generate corresponding ones of a plurality of data words; and
adapting, by a control circuit included in the particular integrated circuit, operation of the voltage regulator circuit based on the plurality of data words.

9. The method of claim 8, wherein the passive circuit element includes an inductor.

10. The method of claim 8, wherein the response of the passive circuit element includes an on-resistance of the passive circuit element.

11. The method of claim 8, wherein adapting the operation of the voltage regulator circuit includes changing, by the control circuit, a duration of an active cycle of the voltage regulator circuit based on a voltage level of a source power supply.

12. The method of claim 8, further comprising generating, by the voltage regulator circuit, a voltage level on a power supply signal using a source power supply.

13. The method of claim 8, further comprising, monitoring, by the control circuit, operation of a computer system that includes the voltage regulator circuit and adjusting an operating mode of the voltage regulator circuit based on results of the monitoring.

14. The method of claim 8, wherein adapting, by the control circuit included in the particular integrated circuit, the operation of the voltage regulator circuit includes adjusting, by the control circuit, at least one operation parameter of the one or more operation parameters based on the wafer-level test data.

15. The method of claim 14, further comprising, sampling, by the measurement circuit, the one or more operating characteristics of the voltage regulator circuit, in response to a computer system, that includes the voltage regulator circuit, completing a boot operation.

16. A non-transitory computer-readable storage medium having design information stored thereon, wherein the design information specifies a design of at least a portion of a hardware integrated circuit in a format recognized by a semiconductor fabrication system that is configured to use the design information to produce the hardware integrated circuit according to the design information, wherein the design information specifies that the hardware integrated circuit comprises:
a voltage regulator circuit configured to generate a voltage level on a power supply of a computer system using a source power supply and based on initial values of one or more operation parameters derived from wafer-level test data;
a passive circuit element coupled to the voltage regulator circuit;
a measurement circuit configured, in response to an activation of a test mode, to:
convert a plurality of bits to an analog voltage level to generate a stimulation signal;
apply the stimulation signal to the passive circuit element;
measure a response of the passive circuit element to the stimulation signal;
sample, at a plurality of sample time points, the response of the passive circuit element to generate corresponding ones of a plurality of data words; and
a control circuit configured to adapt operation of the voltage regulator circuit based on the plurality of data words.

17. The non-transitory computer-readable storage medium of claim 16, wherein to adapt the operation of the voltage regulator circuit, the control circuit is further configured to adjust a value of at least one operation parameter of one or more operation parameters of the voltage regulation circuit.

18. The non-transitory computer-readable storage medium of claim 17, wherein to adjust the value, the control circuit is further configured to change a duration of an active cycle of the voltage regulator circuit based on the voltage level of the source power supply.

19. The non-transitory computer-readable storage medium of claim 17, wherein the measurement circuit is further configured to activate the test mode at respective time periods of a plurality of time periods.

20. The non-transitory computer-readable storage medium of claim 16, wherein the control circuit is further configured to monitor operation of the computer system to generate monitor results, and wherein to adapt the operation of the voltage regulator circuit, the control circuit is further configured to adjust an operating mode of the voltage regulator circuit based on the monitor results.

* * * * *